(12) United States Patent
Jain et al.

(10) Patent No.: US 7,594,195 B2
(45) Date of Patent: Sep. 22, 2009

(54) MULTITHREADED REACHABILITY

(75) Inventors: Jawahar Jain, Santa Clara, CA (US);
Debashis Sahoo, Santa Clara, CA (US)

(73) Assignee: Fujitsu Limited, Kanagawa (JP)

( * ) Notice: Subject to any disclaimer, the term of this patent is extended or adjusted under 35 U.S.C. 154(b) by 213 days.

(21) Appl. No.: 11/421,979

(22) Filed: Jun. 2, 2006

(65) Prior Publication Data

US 2007/0124711 A1    May 31, 2007

Related U.S. Application Data

(60) Provisional application No. 60/688,094, filed on Jun. 7, 2005.

(51) Int. Cl.
*G06F 17/50* (2006.01)
(52) U.S. Cl. ............................... 716/1; 716/3
(58) Field of Classification Search ........... 716/1, 716/3
See application file for complete search history.

(56) References Cited

U.S. PATENT DOCUMENTS

| | | | | |
|---|---|---|---|---|
| 6,871,341 | B1 * | 3/2005 | Shyr | 717/131 |
| 7,124,383 | B2 * | 10/2006 | Chen et al. | 716/5 |
| 7,146,605 | B2 * | 12/2006 | Beer et al. | 717/126 |
| 7,305,582 | B1 * | 12/2007 | Moser et al. | 714/13 |
| 7,340,702 | B2 * | 3/2008 | Wang | 716/5 |
| 2004/0093571 | A1 * | 5/2004 | Jain et al. | 716/5 |
| 2006/0179383 | A1 * | 8/2006 | Blass et al. | 714/738 |

OTHER PUBLICATIONS

Bryant, R.E., Graph-Based Algorithms for Boolean Function Manipulation, IEEE Transactions on Computers, C-35, 1986, pp. 677-691.
Cabodi et al., "Disjunctive Partitioning and Partial Iterative Squaring: An Effective Approach for Symbolic Transversal of Large Circuits," DAC, 1997, pp. 728-733.
Clarke et al., "Design and Synthesis of Synchronization Skeletons Using Branching Time Temporal Logic," In Proc. IBM Workshop on Logics of Programs, vol. 131 of LNCS, pp. 52-71, Springer-Verlag, 1981.
Coudert et al., "Verification of Sequential Machines Based on Symbolic Execution," Proc. of Workshop on Automatic Verification Methods for Finite State Machines, LNCS 407, Springer, 1989, 11 pages.
Garavel et al., "Parallel State Space Construction for Model-Checking," In SPIN Workshop on Model Checking of Software, pp. 217-234. Springer-Verlag New York, Inc., 2001.

(Continued)

*Primary Examiner*—Jack Chiang
*Assistant Examiner*—Suchin Parihar
(74) *Attorney, Agent, or Firm*—Baker Botts L.L.P.

(57) ABSTRACT

In one embodiment, a method for multithreaded reachability analysis includes partitioning a state space of a circuit under analysis into a plurality of partitions and assigning each partition to a thread to carry out a reachability analysis on the partition assigned to the thread. The threads carry out the reachability analyses of the partitions in parallel with each other. The method also includes using one or more of an early communication algorithm and a partial communication algorithm to communicate states from one or more first ones of the partitions to one or more second ones of the partitions to facilitate the reachability analysis of the second ones of the partitions.

17 Claims, 3 Drawing Sheets

OTHER PUBLICATIONS

Heyman et al., "Achieving Scalability in Parallel Reachability Analysis of Very Large Circuits," In CAV, 19 pages, May 30, 2000.

Iyer et al., "Improved Symbolic Verification Using Partitioning Techniques," CHARME 2003, Lecture Notes on Computer Science, 2860.

Jain et al., "Functional Partitioning for Verification and Related Problems," Brown/MIT VLSI Conference, 1992.

McMillan, "Symbolic Model Checking," Kluwer Academic Publishers, 1993.

Narayan et al., "Reachability Analysis Using Partitioned-ROBDDs," In Proc. of the Intl. Conf. on Computer-Aided Design, (ICCAD) pp. 388-393, 1997.

Pixley et al., "A Verification Synergy: Constraint-Based Verification," Electronic Design Processes, 2003.

Ravi, et al., "High-Density Reachability Analysis," ICCAD, 1995, pp. 154-158.

Sahoo et al., "A Partitioning Methodology for BDD-Based Verification," FMCAD, 2004.

Somenzi et al., CUDD: CU Decision Diagram Package, ftp://vlsi.colorado.edu/pub/, 52 pages, 2001.

Stern et al., "Parallelizing the Murphy Verifier," In CAV, pp. 1-12, 1997.

Stornetta et al., Implementation of an Efficient Parallel BDD Package,: In DAC, pp. 641-644, 50 pages, 1996.

VIS. Verilog Benchmarks http://vlsi.colorado.edul- vis/.

Yang et al., "Parallel Breadth-First BDD Construction," Symposium on Principles and Practice of Parallel Programming, pp. 145-156. ACM Press, 12 pages, 1997.

Sahoo et al., "Multi-threaded Reachability," To Appear in DAC.

* cited by examiner

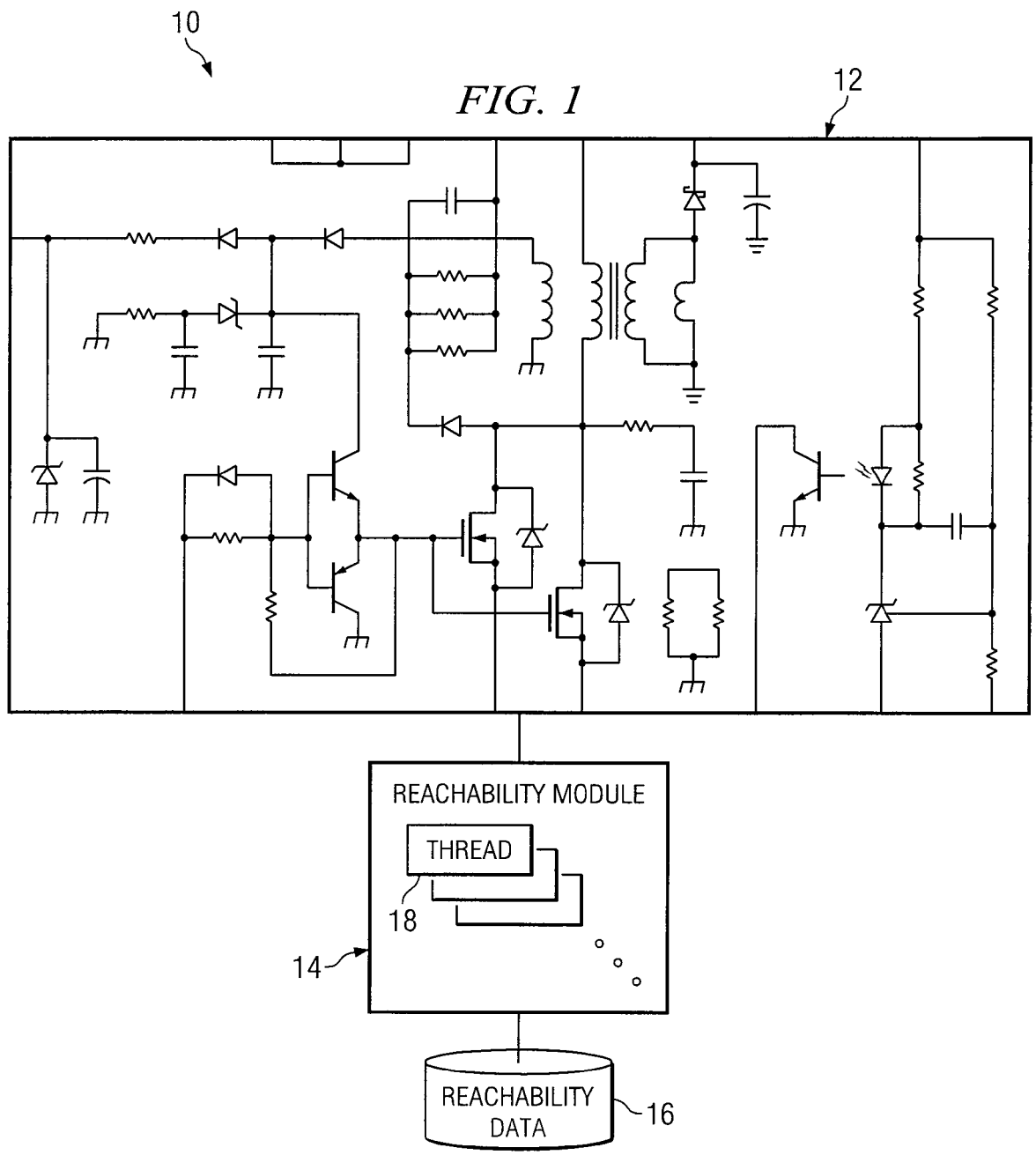

TOTAL WORK=1255s

TOTAL WORK=216s

MULTITHREADED REACHABILITY

RELATED APPLICATIONS

This application claims the benefit under 35 U.S.C. § 119 (e) of U.S. Provisional Application No. 60/688,094 filed Jun. 7, 2005, entitled "Multithreaded Reachability".

TECHNICAL FIELD OF THE INVENTION

This invention relates generally to circuit design and more particularly to multithreaded reachability.

BACKGROUND

Algorithms based on partitioned binary decision diagrams (BDDs) are often used to reduce memory explosion in circuit verification based on BDDs. Because such algorithms tend to suffer from problems associated with scheduling partitions for processing, such algorithms are at times ineffective.

OVERVIEW OF THE INVENTION

According to the present invention, disadvantages and problems associated with circuit design may be reduced or eliminated.

In one embodiment, a method for multithreaded reachability analysis includes partitioning a state space of a circuit under analysis into a plurality of partitions and assigning each partition to a thread to carry out a reachability analysis on the partition assigned to the thread. The threads carry out the reachability analyses of the partitions in parallel with each other. The method also includes using one or more of an early communication algorithm and a partial communication algorithm to communicate states from one or more first ones of the partitions to one or more second ones of the partitions to facilitate the reachability analysis of the second ones of the partitions.

Particular embodiments of the present invention may provide one or more technical advantages. As an example, particular embodiments provide a multithreaded reachability algorithm that reduces or avoids problems associated with scheduling partitions for processing, while increasing latent parallelism in partitioned traversal of state space. Particular embodiments provide a multithreaded reachability algorithm that runs significantly faster than previous reachability algorithms and partitioned approaches. Such embodiments may provide even further gains when implemented using a parallel framework. In particular embodiments, early communication among partitions, partial communication among partitions, or both facilitate continued traversal of state space in one or more partitions, even when one or more other partitions have become too difficult to process further, possibly as a result of memory blowup.

Particular embodiments provide circuit verification results that are better in most cases than algorithms based on ordered BDDs (OBDDs) or partitioned OBDDs (POBDDs) even when running on only one processor. Particular embodiments facilitate locating erroneous states significantly faster than previous approaches based on BDDs. Particular embodiments facilitate locating erroneous states significantly faster than previous reachability algorithms. Particular embodiments are more robust that standard, sequential reachability algorithms based on POBDDs. Particular embodiments facilitate increased parallelism over naive parallelization in standard reachability algorithms based on POBDDs.

Particular embodiments may provide all, some, or none of the technical advantages described above. Particular embodiments may provide one or more other technical advantages, one or more of which may be apparent, from the figures, descriptions, and claims herein, to a person having ordinary skill in the art

BRIEF DESCRIPTION OF THE DRAWINGS

To provide a more complete understanding of the present invention and the features and advantages thereof, reference is made to the following description, taken in conjunction with the accompanying drawings, in which:

FIG. 1 illustrates an example system for multithreaded reachability; and

DESCRIPTION OF EXAMPLE EMBODIMENTS

Figure 2A:
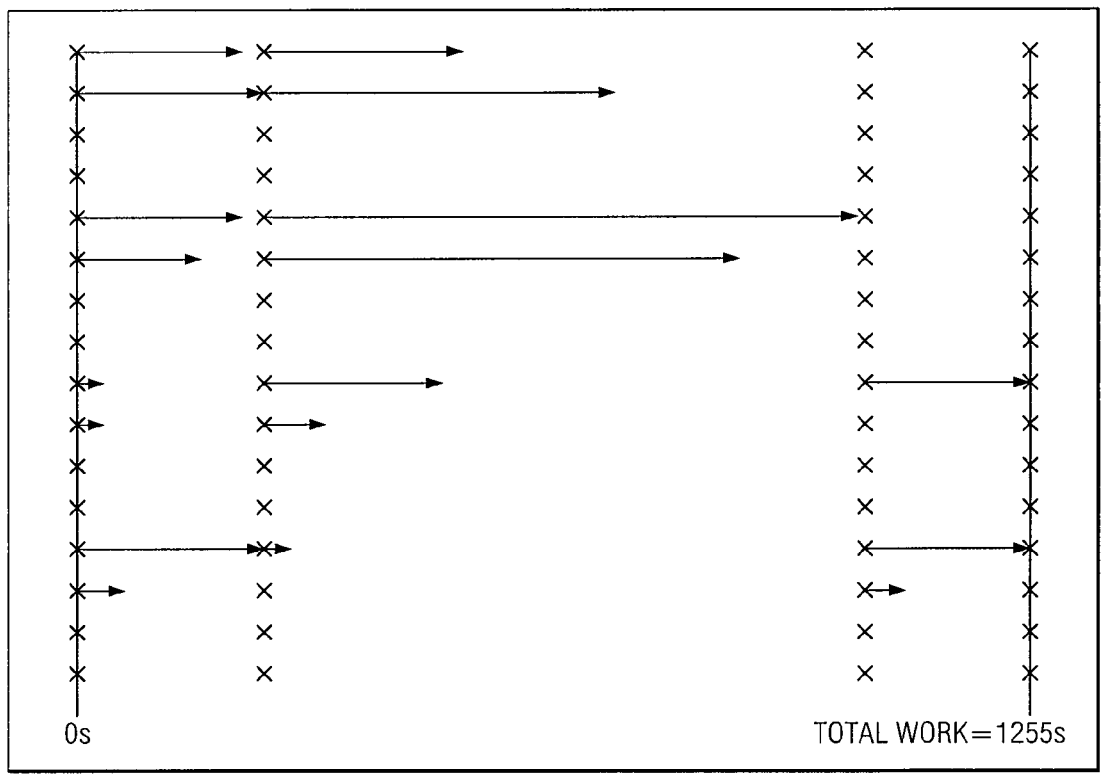
FIGS. 2A-2C illustrate example effects of particular heuristics on the work done by each of multiple threads.

FIG. 1 illustrates an example system 10 for multithreaded reachability. System 10 includes circuit 12. System 10 also includes a reachability module 14 and reachability data 16 for carrying out a reachability analysis on circuit 12, as described below. One or more links couple components of system 10 to each other. As an example and not by way of limitation, a link may include one or more wires in one or more circuit boards, one or more internal or external buses, one or more local area networks (LANs), one or more metropolitan area networks (MANs), one or more wide area networks (WANs), one or more portions of the Internet, or a combination of two or more such links, where appropriate.

Circuit 12 includes hardware or a logical or other representation of hardware for testing to determine whether the hardware operates properly, e.g., according to one or more particular specifications for the hardware. As an example and not by way of limitation, circuit 12 may include circuit components such as gates, counters, inverters, buffers, and other circuit components arranged and coupled to each other to provide particular functionality. As another example, circuit 12 may include a logical or other representation of such components. Circuit 12 may include millions of circuit components. To provide a particular functionality, circuit 12 may need to include one or more properties. Circuit 12 may need to include millions of such properties. In particular embodiments, one or more logical expressions may describe a property of circuit 12. Reference to a "property" of circuit 12 may encompass a logically expressible state, characteristic, behavior, or operation of circuit 12 or another property of circuit 12, where appropriate. Reference to a "state" may encompass one or more properties of circuit 12, where appropriate.

Reachability module 14 includes a hardware, software, or embedded logic component or a combination of two or more such components for accessing circuit 12 via one or more links and carrying out a reachability analysis on circuit 12. In particular embodiments, carrying out a reachability analysis on circuit 12 includes dividing a state space of circuit 12 into multiple partitions and running reachability analyses on the partitions using multiple threads, as described below. Reachability module 14 includes multiple threads 18 for carrying out a reachability analysis on circuit 12. Each thread 18 carries out a portion of the total reachability analysis. Reference to a thread may encompass an instance of a process executable by a processor in parallel with one or more other instances of the process, where appropriate. Reachability data 16 includes data specifying particular parameters of reachability analyses and other data that, in particular embodiments, reachability module 14 uses to carry out a reachability analysis on circuit 12. In particular embodiments, one or more computer systems provide one or more users access to reachability module 14, reachability data 16, or both. As an example and not by way of limitation, a computer system may include reachability module 14 and reachability data 16 and a user may access the computer system to provide input to and receive output from reachability module 14, reachability data 16, or both.

A reachability analysis may include a breadth-first traversal of one or more finite state machines (FSMs). An algorithm for a reachability analysis may take as input a set of initial states and a transition relation (TR) that relates next states reachable from each current state. One or more least fixed point (LFP) computations may generate a set of reachable states. An LFP computation may include a series of image computations carried out until the image computations reach a fixed point. The TR may be conjunctively partitioned into a set of clusters, and a quantification schedule may be associated with a partitioned TR to facilitate early quantification during image computations.

The use of partitioned ordered binary decision diagrams (POBDDs) may improve verification of a circuit 12 based on one or more reachability analyses. The following is an example algorithm for carrying out verification of a circuit 12 based on one or more reachability analyses using POBDDs:

```
POBDD-Reachability(TR, InitStates) {
    Initialize Rch to InitStates
    Create partitioned rep for Rch
    do {
        for (each partition i)
            Calculate LeastFixedPoint (Rch) in partition i
        for (each partition i)
            Communicate states from i to all partitions
    } until (No new state is added to Rch);
}
```

The above algorithm essentially performs as many steps of image computation as possible in each partition i until an LFP is reached in the partition. The algorithm then synchronizes two or more of the partitions with each other by considering the transitions that originate in each partition i and lead out from there. Reference to communication may encompass these cross-partition image computations and subsequent transfers of computed binary decision diagrams (BDDs) from one or more first partitions to one or more second partitions, where appropriate. The above algorithm does not use a strict breadth-first search (BFS) traversal. The algorithm carries out a BFS that is local to individual partitions and then synchronizes to add states resulting from transitions crossing over from one partition to another. Thus, the algorithm uses a region-based BFS according to which individual partitions of a sate space are traversed independently in a breadth-first manner. Reference to a local LFP computation may encompass one or more LFP computations in one or more partitions, where appropriate.

Previous approaches to parallel verification rely on distributed reachability analyses including classical BFS traversals of state space in parallel environments having distributed frameworks and distributed memory. In contrast, particular embodiments of the present invention use a shared-memory model and fast communication between threads 18 to facilitate parallelism. In particular embodiments, transformations (such as, for example, abstraction) may be applied to a circuit 12 before a reachability analysis on circuit 12. Such embodiments improve BDD-based reachability analysis and therefore tend to complement, rather than replace, other verification approaches.

Particular embodiments reach more new states with less computational effort. Standard POBDD-based reachability algorithms take advantage of the efficiency of local LFP computation to reach more states quickly. However, which local LFP computation is easy is not known beforehand. Usually, for most states, there are multiple paths to reach them. They may be reached through a local LFP or through a communication from another partition. It is possible that a set of states are more easily reachable through communication. When a partition finishes early and then through communication provides new states to other partitions then the newly computed set of states may simplify the local LFP computations in the receiving partition. Therefore, the performance of a sequential POBDD-based reachability algorithm should and does depend on the relative order in which the partitions are processed. This is a scheduling problem. It is difficult to employ a greedy strategy to discover the easy computations (partitions) in a sequential environment. However, it is relatively easy to implement this strategy in a multi-threaded environment. The round-robin nature of dividing computing resources between different partitions ensures that the easy partitions finish before the hard partitions. Clearly, increasing the parallelism in a reachability algorithm using multi-threading would enable the greedy discovery of more easy computations, which will help accumulate reachable states faster. Therefore, particular embodiments employ a multi-threaded (parallel) approach and improve parallelism.

The POBDD-based algorithm above is parallelizable. The local LFP computation of each partition combined with their communication may be processed in parallel. Particular embodiments wait for all the partitions to finish their local LFP computation and the communication to begin transferring communicated states to the appropriate partition. However, empirically, this simple parallelization of the algorithm above provides limited parallelism. This may be due to following reasons:

1. High variation of BDD computations. If a partition has a very good variable order or the function it represents is very tractable then its corresponding state space representation may be compact. Correspondingly, the image computation inside that partition is fast; such a partition is an easy partition. On the other hand, if a partition does not find a good variable order or the corresponding function is very difficult, then it gets stuck in reordering large BDDs and doesn't make progress. Such a partition is a hard partition. In a large number of cases, there is a large variation in the runtime of the local LFP computation for each partitions. In such cases, all easy partitions may wait for the hard partitions to finish their image computation, which reduces the parallelism significantly.
2. Depth of the local LFP computation. Another reason for the reduced parallelism may be the fact that the depth of the local LFP computation may vary significantly in each partition. In this case, the partitions with less depth finish faster, whereas the partitions with greater depth take longer to finish. This results in idle threads, which reduces the parallelism.

In practice, a large number of partitions may wait for a few hard partitions. To address this issue, particular embodiments use the following heuristics to improve the parallelism:

1. Early Communication: Communicate states to another partition after reaching a least fixed point.

2. Partial Communication: Initiate a partial communication in an idle thread.

After a partition finishes its local LFP computation, particular embodiments allow the partition to immediately communicate its states to the other partitions. Each partition accepts these communicated states asynchronously during their local LFP computation. This enables the easy partitions to make progress with their subsequent local LFP computation without waiting for the hard partitions to finish. Therefore, the early communication from easy partitions to other easy partitions enables all such partitions to reach a fixed point. This is difficult to achieve in sequential partitioned reachability analysis because such scheduling information is difficult to obtain.

If new states are communicated during early communication, particular embodiments restart the current image computation after adding these states. Such augmentation can make a harder image computation significantly easier in some cases. This may be a result of some of the communicated states corresponding to what were hard states to compute in the receiving partition using the local LFP.

After applying the above technique, in particular embodiments, many partitions may still be waiting for other partitions to communicate some states so that they may continue their local LFP computation. This case tends to arise when all the easy partition finish their local LFP and need communication from a hard partition to make further progress. To improve parallelism, particular embodiments initiate a communication in an idle thread using a small subset of the state space of the hard petition. The communication introduces new states in the easy partitions. This enables easy partitions to make progress further with their collective least fixed point from the communicated states. Intuitively this tries to accelerates the activity among easy partitions. Particular embodiments use one or more small subsets of state space instead of the full state space of the hard partition to reduce the computational effort in communication. This heuristic tries to keep all the threads busy hence it contributes to improving the parallelism. Further, this heuristic may increase the number of early communication instances. Thus, the combined effect of the partial communication and early communication tends to improves parallelism significantly.

The following is an example parallel-reachability algorithm that uses techniques described above.

```
Parallel-Reachability(n, TR, InitStates) {
    Create n partitions for InitStates
    Run in parallel for each partition i{
        After every microstep runs
            ImproveParallelism(i){
            Get all the communicated states
            Calculate LeastFixedPoint (Rch) in partition i
            Compute cross-over states from i to all parts
        }
    } until (No new state is found in any partition);
}
ImproveParallelism(n: Partition Number){
    check and add all the communicated states
        if new states are added
            restart current image computation
        request a waiting partition to initiate
            partial communication procedure
}
```

Particular embodiments run the local LFP computation combined with the communication in parallel. All computation inside a partition may be managed by a dedicated thread. Each thread polls for the communicated states from the other threads. After every micro-step of the image computation, each thread may call a function ImproveParallelism that implements two heuristics for improving parallelism. The first heuristic is to do early communication. As a part of the first heuristic, the function checks whether other threads have communicated some states to the current thread. This simple check and update subroutine performed by each thread implements the early communication heuristics. The second heuristic is to do partial communication. As a part of this heuristic, every active thread checks for an idle thread. If an idle thread is found, the heuristic gives a small subset of the state space from the current partition to the idle thread. The idle thread starts a communication from this subset of states to the partition associated with the idle thread.

In particular embodiments, in a multi-threaded approach, each thread manages a partition. The threads goes back to an idle state if no new states are communicated to the partition associated with that thread. The thread manager asserts a global termination flag if all the threads are idle.

The use of a number of processors in parallel often produces a gain over the sequential algorithms. A multi-threaded approach may add to the overhead while not increasing the amount of resources available. Thus, some multi-threaded approaches may perform only as well as, and perhaps slightly worse than, sequential approaches. However, by avoiding inefficiencies due to the scheduling bottleneck, the use of multi-threading provides significant gains over both POBDD as well as OBDD approaches.

Particular embodiments employ heuristics that are able to improve the parallelism, at least in part, because they avoid unnecessary waiting for the communication of states. Particular embodiments employ heuristics that also use the communicated states in the active local LFP computation. This enables the easy partitions to reach a collective local least fixed point among themselves. Therefore, if an error is present in this fixed point, it is quickly detected. Further, if the error state is present in a hard partition, it is quickly detected using early communication. The greedy nature of multi-threaded reachability allows it to find easy-to-reach paths to the error states. Error detection may happen significantly faster using such an approach.

For some functions, POBDDs are often much smaller than OBDDs. Hence, if the instability of scheduling can be ameliorated by a multi-threaded approach, then, even though the treaded approach will have an overhead, it may complete the full state space traversal faster than other BDD-based methods in passing cases. Particular embodiments may dynamically recognize deep reachability instances, use a communication strategy that accommodates very deep circuits where there is not much parallelism, or both to improve parallelism with respect to very deep circuits.

Figure 2B:
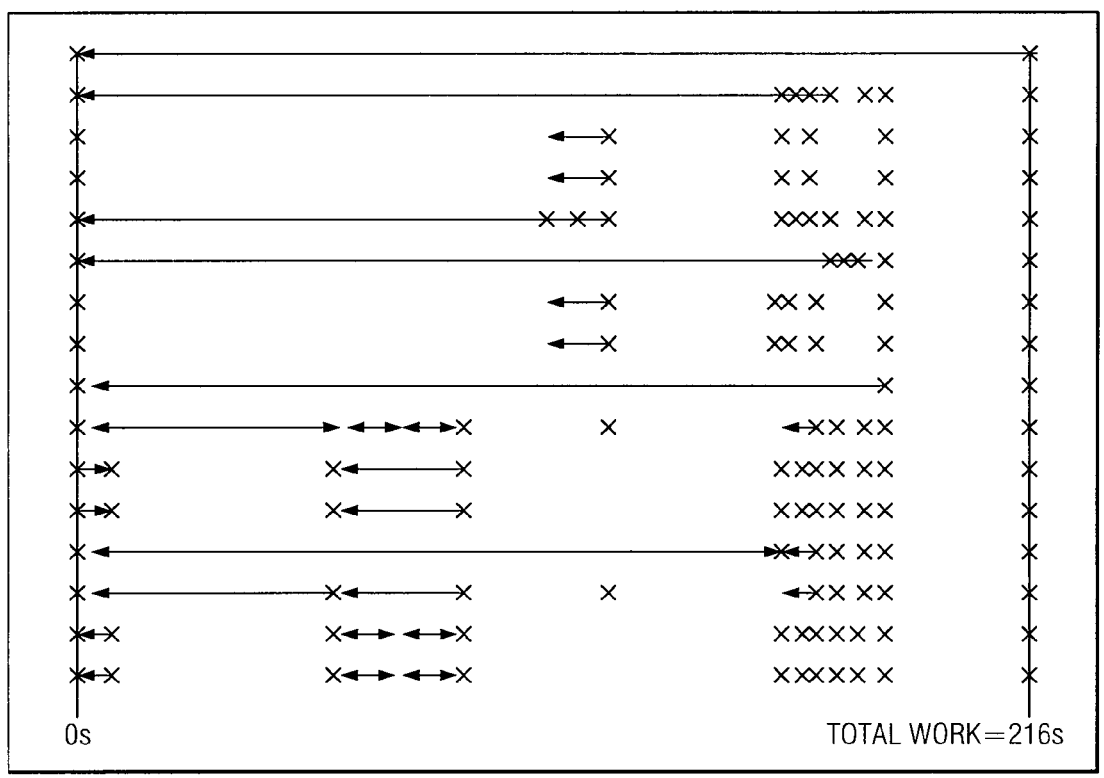
Figure 2C:
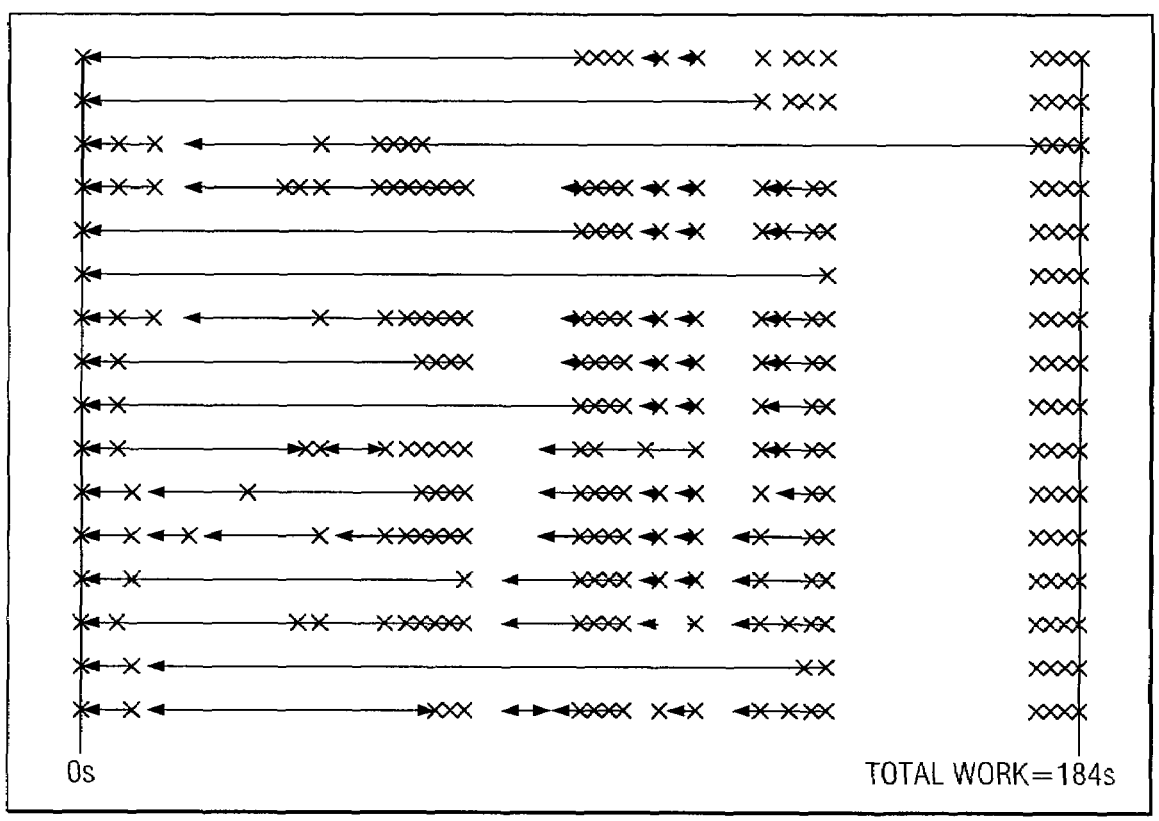

By way of example and not by way of limitation, consider a reachability analysis of a circuit 12. All reachable states need to be computed, and the reachability analysis is performed using sixteen partitions, each of which runs in a separate thread. FIGS. 2A-2C are example Gantt charts illustrating the effects of the heuristics on the amount of work done be each thread. Each partition is represented by a horizontal broken line. The filled segment represents the work time for the partition to perform a computation. At the end of reach such stage, a small cross indicates the communication of states to other partitions. A break in the line indicates that the corresponding thread is idle and is waiting to get some states from another thread. In a multi-processor environment, this corresponds to the idling of the processor. However, in a multi-threaded environment, the processor may schedule another thread for execution. The total time is the work time for executing all threads on a single processor. This does not include the idle time. In other words, the total work time is the sum of the lengths of all segments in the Gantt chart.

FIG. 2A illustrates, by way of example and not by way of limitation, that in a naive multi-threaded execution computations in different partitions are of varying durations and most threads idle until all others finish their local partitions and are ready to communicate. FIG. 2B illustrates example effects of early communication. Each partition communicates as soon as it is done with its local fixed-point computations. Other partitions receive newer states without having to wait for all partitions to finish their local work. This allows for multiple partitions to be explored simultaneously, thus reducing the time from approximately 1255 to approximately 216 seconds when scheduled on a single processor. Less work time is needed to perform full reachability. However, there are still gaps in the scheduling during which some threads idle. FIG. 2C illustrates example effects of partial communication in filling these gaps. When a thread is idle, the thread gets some states from another thread. Such states enable the thread to perform some image computations independently of the partition form which the states were obtained. This ensures a good parallel utilization, however since there may now be redundant work being performed by multiple threads, the total time may increase as measured by the uni-processor case. In the multi-processor case, the processors will be fully utilized, rather than idle. The use of shared memory may facilitate this technique.

Particular embodiments facilitate solution of the problem of how to increase the effectiveness of partitioned-BDD based verification approaches. Their efficiency is often hampered by the scheduling problem, i.e., the relative order in which partitions are traversed. Particular embodiments use a multi-threaded reachability algorithm that intelligently reduces the scheduling problem by doing a round-robin analysis of multiple, perhaps even all, partitions. Further, in particular embodiments, the algorithms increase the parallelism in the partitioned state space traversal. In particular embodiments, they also collect easy to reach states as early as possible by early communication from the easy partitions. For failing properties, this results in finding an easy path to an error state. Although passing cases are less sensitive to the scheduling issue, gains are possible for such properties as well. Thus, particular embodiments are, in most cases (passing or failing), significantly faster than both the standard reachability algorithm as well as the partitioned approaches. The gains are increased when evaluated in context of a shared-memory parallel architecture.

Particular embodiments have been used to describe the present invention, and a person having skill in the art may comprehend one or more changes, substitutions, variations, alterations, or modifications to the particular embodiments used to describe the present invention. The present invention encompasses all such changes, substitutions, variations, alterations, and modifications within the scope of the appended claims.

What is claimed is:

1. A method comprising:
    partitioning a state space of a circuit under analysis into a plurality of partitions, the plurality of partitions comprising one or more first partitions and one or more second partitions;
    assigning each of the plurality of partitions to a thread to carry out a reachability analysis on the partition assigned to the thread, the threads carrying out the reachability analyses of the plurality of partitions in parallel with each other using a computer; and
    using one or more of an early communication algorithm or a partial communication algorithm to communicate states from one or more of the first partitions to one or more of the second partitions to facilitate the reachability analysis of the one or more of the second partitions;
    wherein, according to the early communication algorithm:
        a first partition communicates one or more of its reached states to a second partition after the first partition has reached a least fixed point, the second partition not having reached a least fixed point when the first partition communicates the reached states; and
        in response to the communication of the reached states, the second partition incorporates the communicated states and a current image computation restarts in the second partition to augment the reachability analysis in the second partition.

2. The method of claim 1, wherein two or more of the threads use a shared memory.

3. The method of claim 1, wherein a single processor executes two or more of the threads.

4. The method of claim 1, wherein each of one or more of the reachability analyses comprises a breadth-first traversal of one or more finite state machines (FSMs).

5. The method of claim 1, wherein each of one or more of the reachability analyses comprises one or more least fixed point (LFP) computations for generating a set of reachable states.

6. The method of claim 5, wherein an LFP computation comprises a series of image computations carried out until the image computations reach a fixed point.

7. The method of claim 1, wherein a plurality of computer systems execute the threads.

8. A method comprising:
    partitioning a state space of a circuit under analysis into a plurality of partitions, the plurality of partitions comprising one or more first partitions and one or more second partitions;
    assigning each of the plurality of partitions to a thread to carry out a reachability analysis on the partition assigned to the thread, the threads carrying out the reachability analyses of the plurality of partitions in parallel with each other using a computer; and
    using one or more of an early communication algorithm or a partial communication algorithm to communicate states from one or more of the first partitions to one or more of the second partitions to facilitate the reachability analysis of the one or more of the second partitions;
    wherein, according to the early communication algorithm:
        a first partition communicates one or more of its reached states to a second partition after the first partition has reached a least fixed point, the second partition having reached a least fixed point and being idle when the first partition communicates the reached states; and
        in response to the communication of the reached states, the second partition incorporates the communicated states and resumes the reachability analysis in the second partition, the incorporation of the communicated states facilitating further progress with respect to reachability in at least the second partition.

9. Logic encoded in one or more computer-readable tangible media and when executed operable to:
    partition a state space of a circuit under analysis into a plurality of partitions;
    assign each partition to a thread to carry out a reachability analysis on the partition assigned to the thread, the threads carrying out the reachability analyses of the partitions in parallel with each other; and use one or more of an early communication algorithm-or a partial communication algorithm to communicate states from one or more first ones of the partitions to one or more second ones of the partitions to facilitate the reachability analysis of the second ones of the partitions;

wherein, according to the early communication algorithm:
  a first partition communicates one or more of its reached states to a second partition after the first partition has reached a least fixed point, the second partition not having reached a least fixed point when the first partition communicates the reached states; and
  in response to the communication of the reached states, the second partition incorporates the communicated states and a current image computation restarts in the second partition to augment the reachability analysis in the second partition.

10. The logic of claim 9, wherein a plurality of computer systems execute the threads.

11. The logic of claim 9, wherein two or more of the threads use a shared memory.

12. The logic of claim 9, executable by a single processor.

13. The logic of claim 9, wherein each of one or more of the reachability analyses comprises a breadth-first traversal of one or more finite state machines (FSMs).

14. The logic of claim 9, wherein each of one or more of the reachability analyses comprises one or more least fixed point (LFP) computations for generating a set of reachable states.

15. The logic of claim 14, wherein an LFP computation comprises a series of image computations carried out until the image computations reach a fixed point.

16. Logic encoded in one or more computer-readable tangible media and when executed operable to:
  partition a state space of a circuit under analysis into a plurality of partitions;
  assign each partition to a thread to carry out a reachability analysis on the partition assigned to the thread, the threads carrying out the reachability analyses of the partitions in parallel with each other; and
  use one or more of an early communication algorithm-or a partial communication algorithm to communicate states from one or more first ones of the partitions to one or more second ones of the partitions to facilitate the reachability analysis of the second ones of the partitions;

wherein, according to the early communication algorithm:
  a first partition communicates one or more of its reached states to a second partition after the first partition has reached a least fixed point, the second partition having reached a least fixed point and being idle when the first partition communicates the reached states; and
  in response to the communication of the reached states, the second partition incorporates the communicated states and resumes the reachability analysis in the second partition, the incorporation of the communicated states facilitating further progress with respect to reachability in at least the second partition.

17. A system comprising:
means for partitioning a state space of a circuit under analysis into a plurality of partitions;
means for assigning each partition to a thread to carry out a reachability analysis on the partition assigned to the thread, the threads carrying out the reachability analyses of the partitions in parallel with each other; and
means for using one or more of an early communication algorithm or a partial communication algorithm to communicate states from one or more first ones of the partitions to one or more second ones of the partitions to facilitate the reachability analysis of the second ones of the partitions;

wherein, according to the early communication algorithm:
  a first partition communicates one or more of its reached states to a second partition after the first partition has reached a least fixed point, the second partition not having reached a least fixed point when the first partition communicates the reached states; and
  in response to the communication of the reached states, the second partition incorporates the communicated states and a current image computation restarts in the second partition to augment the reachability analysis in the second partition.

* * * * *